United States Patent
Vannucci

(10) Patent No.: US 6,175,270 B1
(45) Date of Patent: *Jan. 16, 2001

(54) METHOD AND APPARATUS FOR TAILORED DISTORTION OF A SIGNAL PRIOR TO AMPLIFICATION TO REDUCE CLIPPING

(75) Inventor: Giovanni Vannucci, Middleton, NJ (US)

(73) Assignee: Lucent Technologies Inc., Murray Hill, NJ (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/035,213

(22) Filed: Mar. 5, 1998

(51) Int. Cl.$^7$ .................................................. H01L 21/465
(52) U.S. Cl. ............................. 330/2; 330/149; 455/126
(58) Field of Search ...................... 330/2, 149; 455/126

(56) References Cited

U.S. PATENT DOCUMENTS

| | | |
|---|---|---|
| 3,675,138 | 7/1972 | Standing . |
| 4,048,573 * | 9/1977 | Evans et al. ............................. 330/2 |
| 4,331,928 * | 5/1982 | Heidt .................................... 330/149 |
| 5,126,687 | 6/1992 | Onoda et al. . |
| 5,287,387 | 2/1994 | Birchler ................................. 375/60 |
| 5,638,403 | 6/1997 | Birchler ............................... 375/296 |
| 5,694,082 | 12/1997 | Schmidt . |

* cited by examiner

Primary Examiner—Michael B Shingleton
(74) Attorney, Agent, or Firm—Gibbons, Del Deo, Dolan, Griffinger & Vecchione

(57) ABSTRACT

In order to minimize the adverse effects of RF signal nonlinearities during amplification, especially the deleterious effects of signal clipping which may cause uncontrolled out-of-band emissions known as "spectral regrowth", the specification relates to a device and a method for intentionally distorting a radio frequency (RF) signal in a "tailored manner", prior to the amplification of the RF signal. The device monitors the amplitude of a RF signal at the inlet of a "tailored" distorter. A modifying signal waveform is generated whenever the amplitude of the monitored RF signal is greater than a threshold value. The RF signal is delayed to account for signal processing time associated with the generation of the modifying signal waveform. The generated modifying signal waveform is then summed with the delayed RF signal, thereby forming an intentionally distorted version of the original RF signal. The distorted signal is conveyed to a RF signal amplifier for amplification. The modifying waveform is chosen so as to reduce the amplitude of the RF signal peak to a value that does not exceed the clipping threshold. Furthermore, the modifying waveform is chosen ("tailored") to be less harmful than the effects of the clipping distortion it replaces. The modifying waveform may be completely in-band, out-of-band, or have components of each, depending upon the specific implementation and the desired power spectrum. The process is compatible with current predistortion techniques and may used in conjunction with, or in lieu of, signal predistortion.

25 Claims, 6 Drawing Sheets

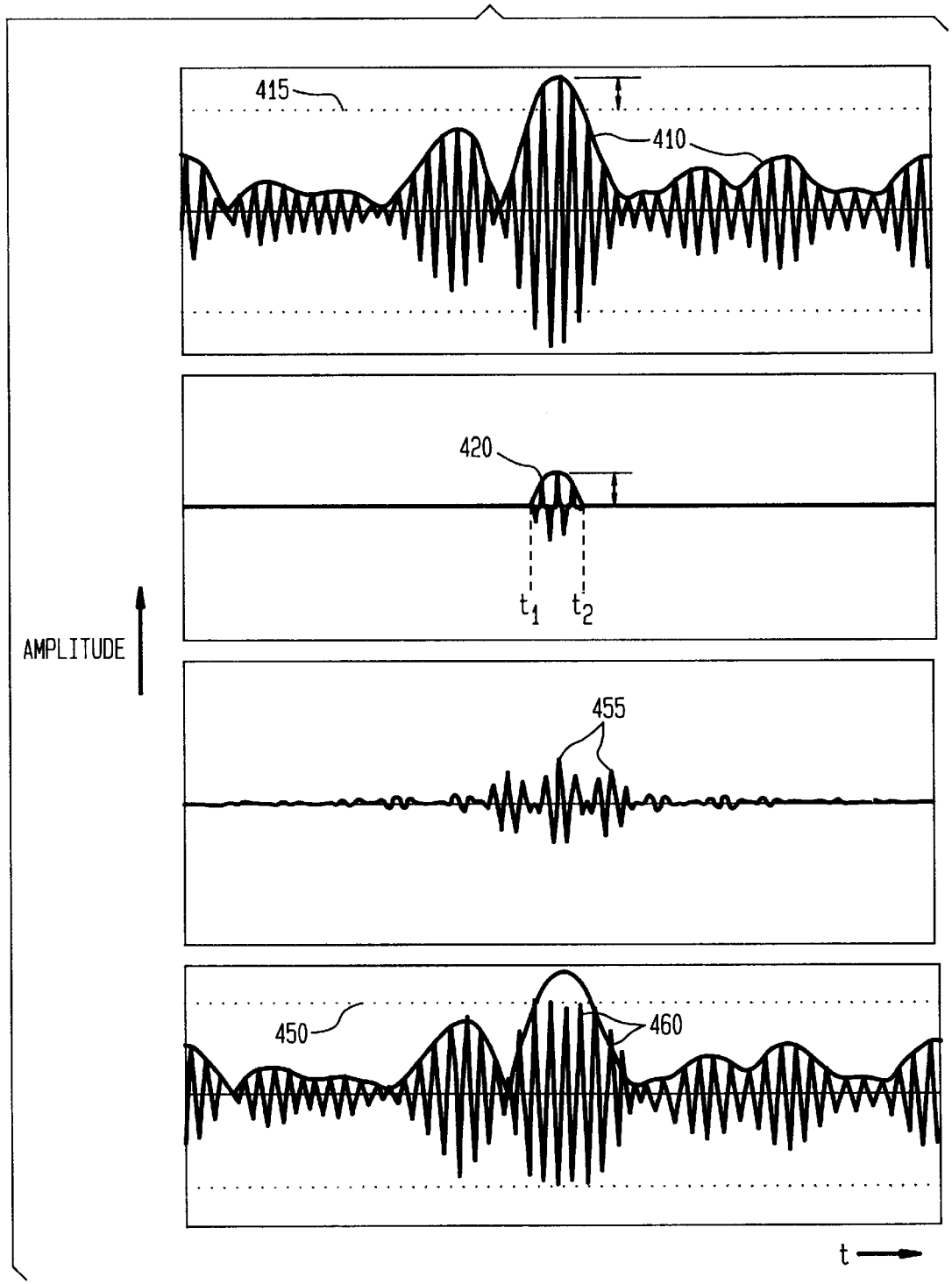

METHOD AND APPARATUS FOR TAILORED DISTORTION OF A SIGNAL PRIOR TO AMPLIFICATION TO REDUCE CLIPPING

FIELD OF THE INVENTION

This invention relates generally to signal amplification and, in particular, to intentionally induced distortion techniques utilized prior to and in conjunction with signal amplification.

BACKGROUND OF THE INVENTION

The function of a linear power amplifier is to amplify a signal with as little waveshape alteration as is practical. The ideal amplifier is therefore characterized as having a transfer function (input signal compared to output signal) which is completely linear with no transfer function discontinuities. Unfortunately, physical processes are seldom ideal and signal amplifiers are no exception. Amplifiers are specifically designed to operate as linearly as possible within their "linear region," but amplifier nonlinearities are a reality in any amplifier design. Additionally, amplifiers which are "overdriven" deliver a clipped output signal. An amplifier is overdriven, and therefore the output signal is clipped, when the input signal possesses peak amplitudes which cause the amplifier to saturate (no appreciable increase in output amplitude with an increase in input amplitude) or to shut-off (no appreciable decrease in output amplitude with a decrease in input amplitude). Generally, an amplifier is characterized as having a "clipping threshold." Input signals having amplitudes beyond the clipping threshold are clipped at the amplifier output.

One method of ameliorating the effects of nonlinear amplifier performance within the amplifier "linear region" is to intentionally distort the preamplified RF signal to anticipate and complement the recognized nonlinear trait of the amplifier. The device which performs this function is known as a signal predistorter (hereinafter referred to as a "predistorter"). Since the departure from linearity of an amplifier operating in its "linear region" is known (as characterized by a deviation of its transfer function in the "linear region" from that of an ideal amplifier's transfer function), a predistorter intentionally distorts a preamplified signal by compensating for the known nonlinearity in a complementary fashion. Thus, when the intentionally distorted preamplified signal is amplified, the nonlinearity of the amplifier causes the amplified version of the intentionally distorted signal to more closely resemble the waveshape of the original signal (the signal prior to amplification and predistortion). Predistortion is thus an effective method for compensating for amplifier nonlinearities within the "linear region" of an amplifier, and as such is frequently referred to as an amplifier linearization circuit.

However, conventional amplifier linearization (predistortion) techniques do not compensate for the resultant adverse effects when the amplified signal nonlinearity is the result of clipping. In a wireless RF transmitter, the presence of signal clipping at the power amplification stage presents an especially onerous problem. Specifically, clipping of a RF signal typically results in significant quantities of spectral regrowth (emission of RF signal energy outside the intended frequency band). In a wireless RF environment, where a high priority is placed upon effective and efficient utilization of limited bandwidth, the production of spectral regrowth causes RF interference emissions outside of the intended (or allocated) frequency band and therefore noise (interference) within unintended (nonallocated) frequency bands. The severity of these out-of-band emissions is proportional to the shortness and abruptness with which the clipping of the RF signal waveform occurs.

In the prior art, compensation for clipping within a power amplifier involved generating a compensating window to apply to a RF signal and multiplying a predetermined windowing function with the RF signal to be amplified. This method, disclosed in U.S. Pat. Nos. 5,287,387 and 5,638,403, is operable to reduces, but does not eliminate, spectral regrowth. Therefore, there exists a need for an improved method and device with which to further minimize the deleterious effects of clipping and other nonlinearities which occur during signal amplification.

SUMMARY OF THE INVENTION

Accordingly, the present invention is a device and a method for intentionally distorting a signal in a "tailored" manner, prior to the amplification of the signal, in order to prevent the deleterious effects of amplifier nonlinearities when the signal is amplified. "Tailoring a signal" involves altering the inherent waveshape of a signal in order to: (i) avoid unwanted output signal characteristics that may be induced during amplification, and/or (ii) induce desirable output signal characteristics during amplification. The manner and type of signal tailoring which is performed is dependent upon the specific amplifier application. For example, the present invention is especially useful when used to ameliorate the effects of clipping distortion upon a radio frequency (RF) signal, but should not be construed as limited to such applications. When utilized in conjunction with a RF system, and used to ameliorate the deleterious effects associated with RF signal clipping during amplification, the present invention monitors the amplitude of a RF signal prior to amplification. A modifying signal waveform is generated whenever the amplitude of the monitored RF signal is greater than a threshold value, chosen to correspond to the amplifier's clipping threshold. The RF signal is delayed to account for signal processing time associated with the generation of the modifying signal waveform. The generated modifying signal waveform is then summed with the delayed RF signal, thereby forming a intentionally modified (distorted) version of the original RF signal which no longer exceeds the amplifier clipping threshold. The modified signal is then conveyed to a RF signal amplifier for amplification. Since, amplifier clipping is prevented in this manner, the amplification process minimizes or prevents out-of-band emissions which would otherwise have occurred. The tailored distortion process which comprises the present invention is compatible with known predistortion techniques and may used in conjunction with, or in lieu of conventional signal predistortion.

The generation and use of a tailored distortion pulse in accordance with the present invention is advantageous since control over the power spectrum for the distorting pulse is maintained in a system which adds the tailored distortion pulse to the signal waveform to be modified. By doing so, the additive pulse is matched to the power spectrum of the signal waveform, thus reducing or preventing out-of-band emissions.

An alternative embodiment of the present invention tailors the intentional distortion in a pre-determined manner so as to prevent clipping of the RF signal during the subsequent amplification process, but does so not to eliminate out-of-band emissions, but rather to control the degree and severity of such out-of-band emissions and to predetermine the spectral composition of the emissions. This scheme is utilized in those various amplifier applications in which it is acceptable to emit power in specified bands outside the signal bandwidth. For example, a cellular base station may transmit in cellular channels not currently utilized, or in channels that are utilized by another base station that is sufficiently distant so as not to be adversely affected by the interference caused by out-of-band emissions.

BRIEF DESCRIPTION OF THE DRAWINGS

A more complete understanding of the present invention may be obtained from consideration of the following description in conjunction with the drawings in which:

FIG. 4b is a graph illustrating RF signal waveforms associated with an amplification system without an incorporated tailored distorter, and a comparison with the waveforms associated with an amplification system incorporating an exemplary embodiment of a tailored distorter with power spectrum placement outside of the RF signal waveform band, in accordance with the present invention;

DETAILED DESCRIPTION

Although the present invention is particularly well suited for use within a wireless communication system, and is so described with respect to this application, it is also applicable for use in conjunction with any signal amplifier, including audio amplifiers and RF amplifiers. The present invention is also compatible with existing amplifier linearization techniques (such as predistortion) and may be used in conjunction with, or in lieu of, such amplifier linearization techniques, as would be apparent to those skilled in the art. When utilized within a wireless communication system, the present invention is compatible with all forms of multiple access, including but not limited to, Code Division Multiple Access (CDMA), Frequency Division Multiple Access (FDMA), and Time Division Multiple Access (TDMA). Analysis of the present invention described herein is performed in a context in which the deleterious effects of RF signal clipping are circumvented through the use of the present invention. However, alternative embodiments in which the avoidance of other amplifier nonlinearities are a paramount concern are also contemplated, as would be apparent to those skilled in the art.

Figure 1:
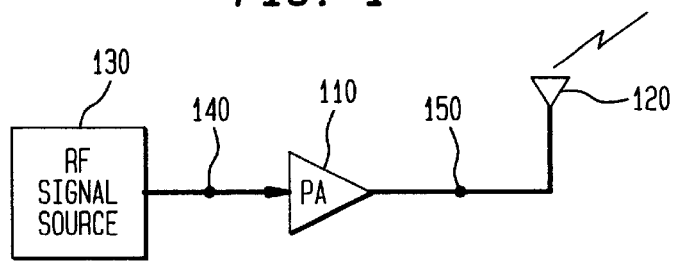
FIG. 1 is a simplified block diagram illustrating a signal amplifier without a predistorter and without a tailored distorter, incorporated within a wireless RF transmission system.

FIG. 1 is a simplified block diagram illustrating a signal amplifier without a predistorter and without a tailored distorter, incorporated within a wireless RF transmission system. Shown is a power amplifier 110 with an outlet port coupled to an antenna 120 operable to transmit a RF signal thereover. A RF signal source 130 is coupled to an inlet port of the power amplifier 110, thereby providing the power amplifier with the RF signal to be amplified. The signal waveform at node 140 at time (t) may be expressed as s[t]. For an ideal power amplifier having a gain (G), the power amplifier output is G(s[t]). However, due to inherent amplifier nonlinearities, perfect amplified reproduction is not feasible and the power amplifier output available at node 150 can be expressed as $$G(s[t]+d_1[t]),$$

where $d_1[t]$ is a distortion term, which when multiplied by gain, G, represents the deviation in an actual power amplifier output amplitude from that of an ideal amplifier (operating within their respective "linear" regions), as a function of time.

Figure 2:
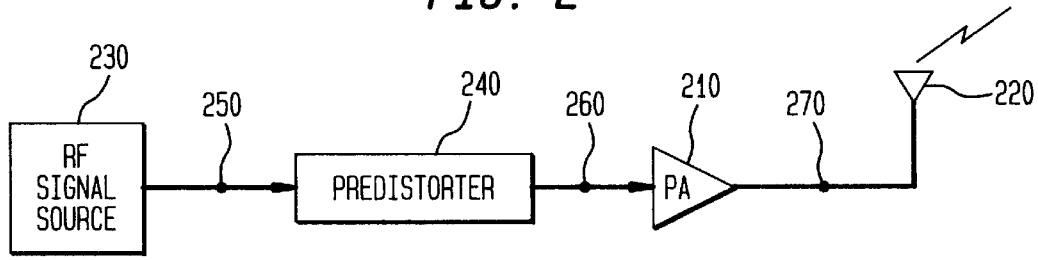
FIG. 2 is a simplified block diagram illustrating a signal amplifier with a predistorter, but without a tailored distorter, incorporated within a wireless RF transmission system.

FIG. 2 is a simplified block diagram illustrating a signal amplifier utilizing a signal predistorter, but without the tailored distorter of the present invention, incorporated within a wireless RF transmission system. Shown is a power amplifier 210 with an outlet port coupled to an antenna 220 operable to transmit a RF signal thereover. A RF signal source 230 is coupled to the inlet of a predistorter 240. Predistortion is provided to intentionally distort a preamplified signal, thereby compensating for known nonlinearities in the "linear region" of the transfer function of a specific amplifier. The predistorter outlet is coupled to an inlet port of the power amplifier 210, thereby providing the power amplifier with the RF signal to be amplified. Signal amplitude at node 250 at time (t) may be expressed as s[t]. The signal waveform at node 260 at time (t) is therefore expressed as $$(s[t]+d_2[t]),$$

where $d_2[t]$ is that quantity of signal waveform distortion intentionally introduced within the predistorter 240 so as to counterbalance the inherent deviation from an idealized amplified waveform at the power amplifier output. For a power amplifier 210, providing a predistorted amplifier inlet signal of $\{s[t]+d_2[t]\}$, will result in an amplified RF signal at node 270 of:

$$G(s[t]+d_2[t]+d_2[t])=G(s[t]),$$

wherein the magnitude of predistorted component $d_2[t]$ is produced to approximate the magnitude of $d_2[t]$, albeit with opposite sign, thus effectively canceling distortion created in the power amplifier (due to nonlinearities in the "linear region"). Therefore a power amplifier utilizing a linearization predistorter effectively produces an amplified RF signal at node 270 of $G(s[t])$.

Figure 3:
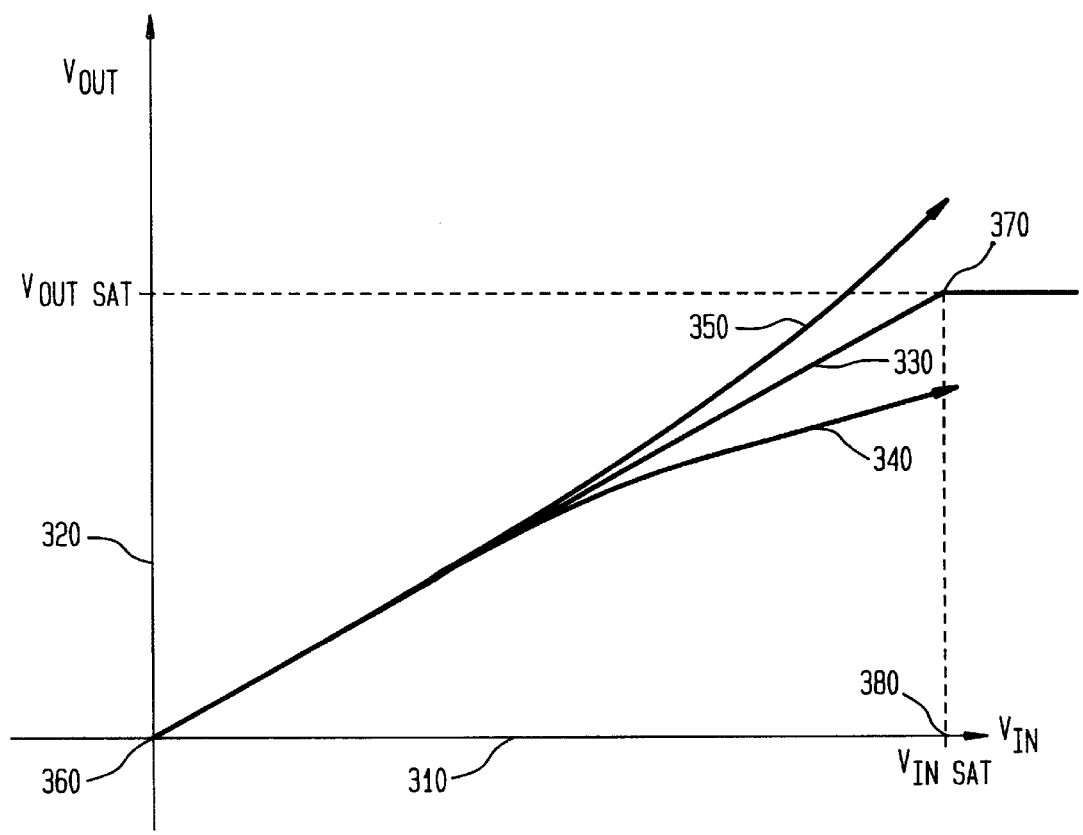
FIG. 3 is a graph illustrating a comparison between the transfer functions of an ideal amplifier, a RF signal amplifier, and a predistorter.

FIG. 3 is a graph illustrating a comparison between the transfer functions of an ideal amplifier, a RF signal amplifier, and a predistorter. Component input voltage ($V_{in}$) is plotted along the horizontal axis 310, while component output voltage ($V_{out}$) is plotted along the vertical axis 320. For the ideal amplifier transfer function 330 and the RF signal amplifier transfer function 340, $V_{out}/V_{in}$ represents the gain across the amplifier. The predistorter transfer function 350 represents $V_{out}/V_{in}$ for the predistorter, thus the magnitude of the vertical scale is reduced by a factor approximately equal to the amplifier gain (G) when compared to the vertical scale magnitudes associated with the amplifier transfer functions 330,340. Although the transfer functions of FIG. 3 are represented in terms of component inlet and outlet voltages, other parameters may be used for transfer function definition (such as current) as would best apply to certain amplifier configurations and as would be apparent to those skilled in the art.

For the ideal amplifier, the transfer function 330 begins at the graph's origin 360 with an exactly linear relationship between $V_{in}$ and $V_{out}$ until the saturation point 370 is reached. The saturation point 370 is the point along the transfer function at which an increase in the value of $V_{in}$ no longer results in a corresponding increase in the value of $V_{out}$. That portion of the ideal amplifier transfer function 330 between the origin 360 and the saturation point 370 is the linear region. The ideal amplifier is therefore a completely linear amplifier for values of $V_{in}$ corresponding to points ranging between the origin 360 and the saturation point 370. Values of $V_{in}$ outside of this range result in clipping of the amplified signal. For an ideal amplifier having a gain (G) and operating completely within the linear region, an inlet signal of $V_{in}=s[t]$ results in an outlet signal value of $V_{out}=G(s[t])$.

Transfer function 340 represents the relationship between $V_{in}$ and $V_{out}$ for an actual RF signal amplifier. The actual RF signal amplifier also possesses a "linear region," within which nearly linear amplification of a RF signal is possible. However, some degree of nonlinearity is always produced, even when amplification is confined within the "linear region" of the transfer function 340. Values of $V_{in}$ outside this "linear region" are typically avoided for linear amplifier operation since these values may result in gross output signal nonlinearities and ultimately in the clipping of the amplified signal. Therefore, for an actual RF signal amplifier having an average gain (G) and operating completely within the "linear region," an inlet signal of $V_{in}=s[t]$ results in an outlet signal value of $$V_{out}=G(s[t]+d[t]),$$

where $d[t]$ is a distortion term, which when multiplied by gain, G, represents the deviation in the actual RF signal amplifier output amplitude from the output of an ideal linear amplifier, $G(s[t])$.

Transfer function 350 represents the relationship between $V_{in}$ and $V_{out}$ for a predistorter. As previously described, a predistorter intentionally distorts a signal, ($V_{in}=s[t]$) prior to amplification, in order to compensate for the known nonlinearities in the "linear region" of the transfer function of the actual RF signal amplifier. Therefore, the output of the predistorter is approximately equal to the algebraic sum of the inlet signal value ($s[t]$) and an intentional error term ($d[t]$) which anticipates and cancels the RF signal amplifier distortion term ($d[t]$). Under optimal conditions, a predistorter (amplifier linearization circuit) will have the effect of correcting the nonlinearities of an actual RF amplifier within the "linear" region, as illustrated by actual amplifier transfer function 340, to yield a combined transfer function (encompassing the predistorter and amplifier circuits) close to the ideal transfer function 370. A predistorter does not, however, compensate for clipping distortion that occurs when the signal input exceeds the amplifier saturation threshold 380. The present invention anticipates such clipping distortion and sums a predetermined compensation signal with the signal to be amplified (prior to amplification) to prevent the deleterious effects of amplifier clipping.

Figure 4A:
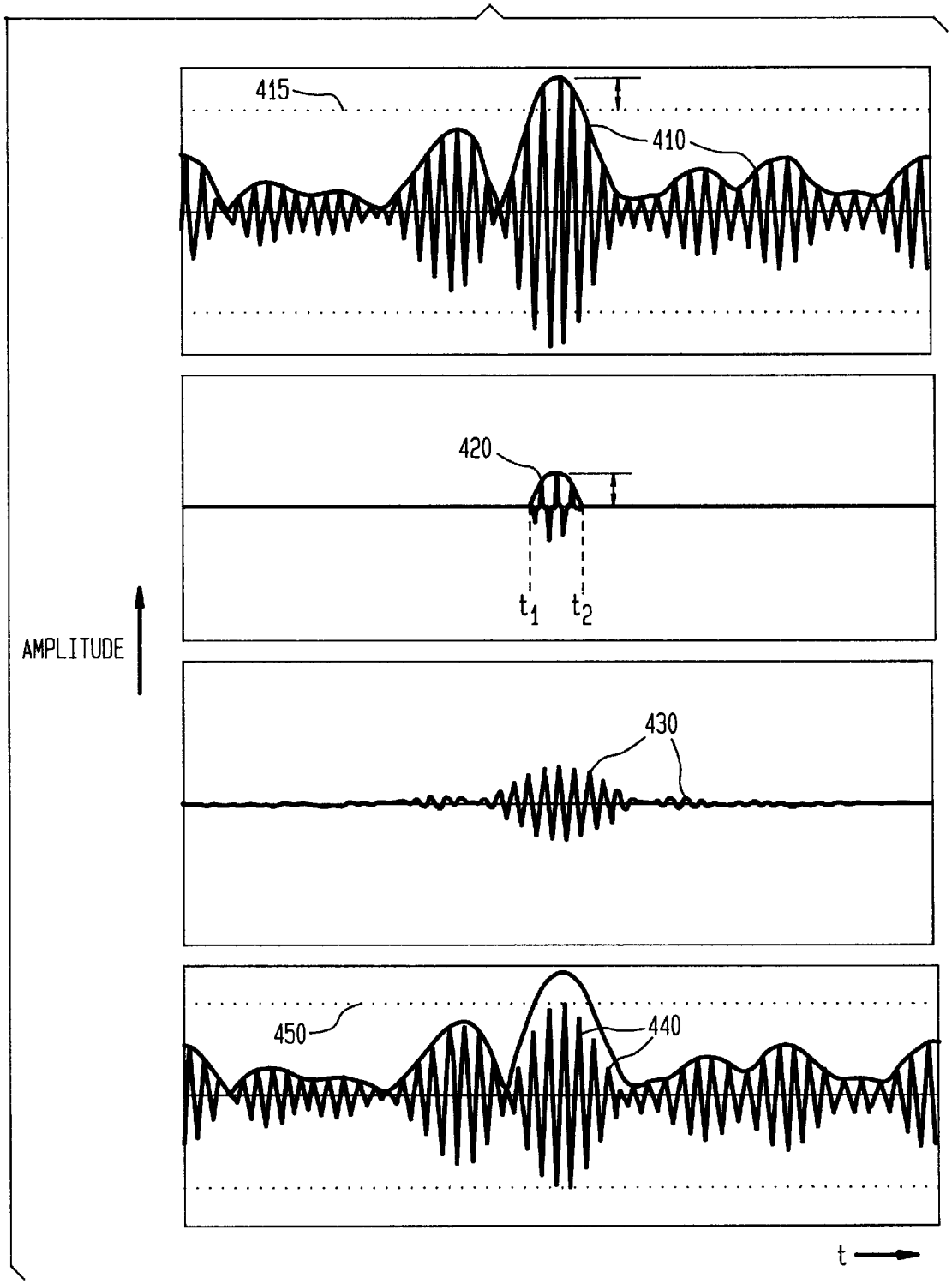
FIG. 4a is a graph illustrating RF signal waveforms associated with an amplification system without an incorporated tailored distorter, and a comparison with the waveforms associated with an amplification system incorporating an exemplary embodiment of a tailored distorter with power spectrum placement within the RF signal waveform band, in accordance with the present invention.

FIG. 4a is a graph comparing the RF signal waveforms of an amplification system incorporating an exemplary embodiment of the tailored distorter which comprises the present invention with the RF signal waveforms of an amplification system without a tailored distorter. The graph is presented prior to describing exemplary embodiments of the present invention (in accordance with FIGS. 5a, 5b, and 6) so as to illuminate the purpose and function for implementing the present invention and additionally to illustrate the effect that the present invention imposes upon RF signal waveforms and differentiate that effect from the effect if a prior art predistorter. Each waveform graph displays time on the horizontal axis and relative signal amplitude along the vertical axis.

In a RF amplification scheme not incorporating the tailored distortion of the present invention, waveform 410 depicts an illustrative signal amplitude versus time for a RF signal at the inlet port of a RF power amplifier. A clipping threshold value 415 is shown. The clipping threshold value 415 represents that value of the RF signal waveform 410 present at the inlet port of the RF power amplifier above which clipping distortion at the outlet port of the RF power amplifier occurs. When the value of the RF signal waveform 410 is less than or equal to the clipping threshold value 415, clipping will not occur at the RF power amplifier. For the instant illustrative RF signal waveform 410, signal amplitude is less than the clipping threshold value 415 until time $t_1$, at which time clipping of the RF power amplifier outlet signal begins. Clipping of the RF power amplifier outlet signal continues until time $t_2$, at which time the amplitude of the RF signal 410 returns to and remains below the clipping threshold value 415. That portion of the RF signal waveform 410 present at the inlet to the RF power amplifier which results in subsequent clipping (during time period $t_1$ to $t_2$), is shown as the distortion-causing waveform 420. The amplitude of the distortion-causing waveform 420 is equal in magnitude to the difference between the peak value of the RF signal waveform 410 and the clipping threshold value 415. The distorted output waveform can therefore be expressed as the sum of the desired output waveform 410 and the unwanted distortion-causing waveform 420.

The clipping which occurs during time period $t_1$ to $t_2$ results in an abrupt and severe deviation in the RF signal waveshape at the power amplifier outlet (characterized by a nearly instantaneous change in slope). RF signal clipping results in significant quantities of spectral regrowth (emission of RF signal energy outside of the intended frequency band). The severity of the out-of-band emissions is proportional to the abruptness and severity with which the RF signal waveform 410 is clipped, and can be calculated by computing the power spectrum of the unwanted additive distortion-causing waveform 420. It will be apparent to those skilled in the art that such a spectrum contains a significant quantity of energy outside of the bandwidth of waveform 410, even if waveform 410 has been filtered through narrowband filters to restrict the production of out-of-band components.

The present invention utilizes a tailored distorter to selectively distort the RF signal waveform in order to minimize the deleterious effects caused by uncontrolled distortion (such as clipping). For example, in accordance with the instant exemplary embodiment as illustrated in FIG. 4, there is shown a tailored distortion signal 430 and a modified RF signal waveform 440. The present invention sums the tailored distortion signal 430 with the RF signal waveform 410, resulting in the modified RF signal waveform 440. When the tailored distorter is utilized to minimize the deleterious effects of clipping, the magnitude of the tailored distortion signal 430 is typically equal to or greater than the magnitude of the distortion causing-waveform 420 (from $t=t_1$ through $t=t_2$). The shape of the generated tailored distortion signal 430 is chosen to have a power spectrum with more clipping-tolerable characteristics than the power spectrum of distortion-causing waveform 420. In the instant exemplary embodiment, the tailored distortion signal 430 is chosen such that it has no spectral components outside the band occupied by RF signal waveform 410. Note that the resulting modified RF signal waveform 440 remains below the clipping threshold value 450 (the same clipping threshold value shown in conjunction with the RF signal waveform 410) at all times. Therefore, with the modified RF signal waveform 440 as input to the RF power amplifier, clipping during amplification does not occur, and as a result, no spectral re-growth is generated during amplification.

The instant exemplary embodiment of the present invention is illustrated as utilizing a dampened oscillatory waveshape as the tailored distortion signal 430. The dampened oscillatory waveshape 430 is chosen to advantageously have a band-limited power spectrum, as is well known in the art. For example, an oscillatory waveform represented by the signal $$\sin \omega t / \omega t \cos \omega_0 t$$

has a bandwidth equal to $\omega/\pi$ centered around the frequency $\omega_0/2\pi$ and a peak amplitude of unity. A similar mathematical expression is used to generate the exemplary dampened oscillatory waveform 430. While generated waveshape 430 is not time-limited, various methods needed to produce an equivalent time-limited waveshape, a waveshape which possesses a power spectrum substantially bandlimited within the bandwidth of $\omega/\pi$, are well known to those skilled in the art (for example, by truncating the leading and trailing portions of waveshape 430).

The exemplary tailored distortion waveform 430 has been chosen to eliminate amplifier generated spectral regrowth by allocating all generated spectral components within the band occupied by RF signal waveform 410. However, in various amplifier applications it is acceptable to emit power in specified bands outside the signal bandwidth. For example, a cellular base station may transmit in cellular channels not currently utilized, or in channels that are utilized by another base station that is sufficiently distant so as not to be adversely affected by the interference caused by out-of-band emissions.

Figure 4C:
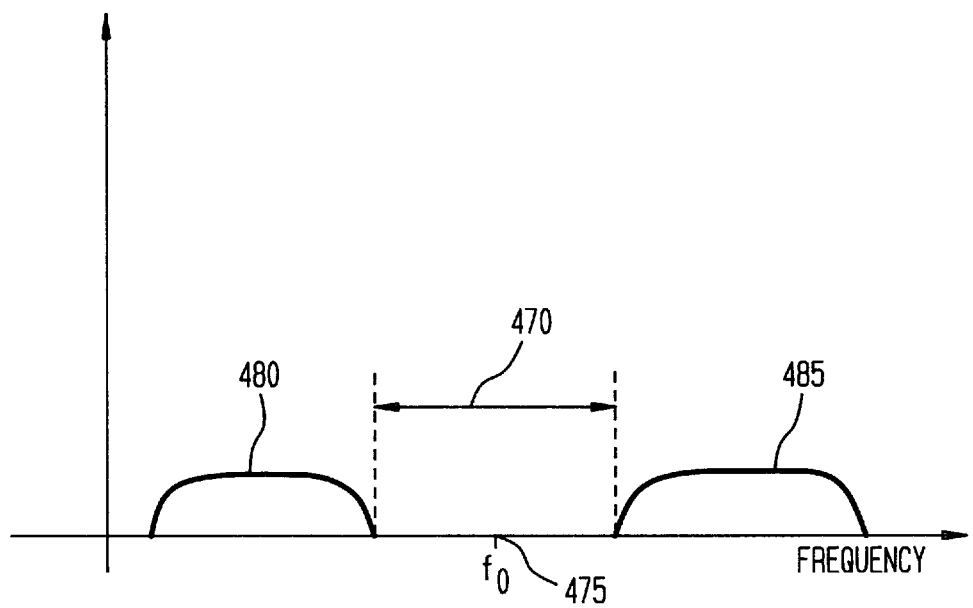
FIG. 4c illustrates an exemplary out-of-band spectrum generated by the tailored distortion waveform of FIG. 4b, in accordance with the present invention.

FIG. 4b is a graph comparing the RF signal waveforms of an amplification system incorporating an exemplary embodiment of the tailored distorter which comprises the present invention with the RF signal waveforms of an amplification system without a tailored distorter. However, whereas the tailored distortion waveform 430 of FIG. 4a is utilized so as to generate no out-of-band spectral emissions, the tailored distortion waveform 455 of FIG. 4b is shaped to selectively place a portion of the power spectrum of an amplified signal outside the signal bandwidth. FIG. 4c illustrates an exemplary out-of-band spectrum generated by the tailored distortion waveform 455 of FIG. 4b. Note that the generated power spectrum is confined to a lower band 480 and an upper band 485 symmetrically spaced around signal center frequency, $f_0$ 475, and occurring completely outside the originating RF signal waveform bandwidth 470.

Additionally, yet other embodiments of the present invention are contemplated which generate tailored distortion waveforms which generate power spectra both within and outside of the RF signal waveform 410 bandwidth. The choice of which tailored distortion waveform pulse to use may be fixed or variable. For example, the choice of tailored distortion waveform in yet another embodiment of the present invention is determined in response to the monitoring of a utilization pattern of frequency-adjacent radio channels. Further, in the instant illustrated embodiment of FIGS. 4(a–b), the tailored distortion waveform is selected to minimize the deleterious effects of signal clipping, however, tailored distortion may also be utilized to minimize the deleterious effects of other nonlinearities and discontinuities associated with amplification of a signal, as would be apparent to those skilled in the art. The present invention is also equally applicable whether applied over the modulating envelope of a RF signal waveform in which a plurality of consecutive amplitude peaks of the RF signal are clipped, or whether applied separately to each individual amplitude peak of the RF signal itself. It therefore would be apparent to those skilled in the art that techniques described herein for manipulating the power spectrum of a tailored distortion pulse can also be applied to produce a tailored distortion waveform with specific desirable characteristics other than a pre-determined power spectrum.

Figure 5A:
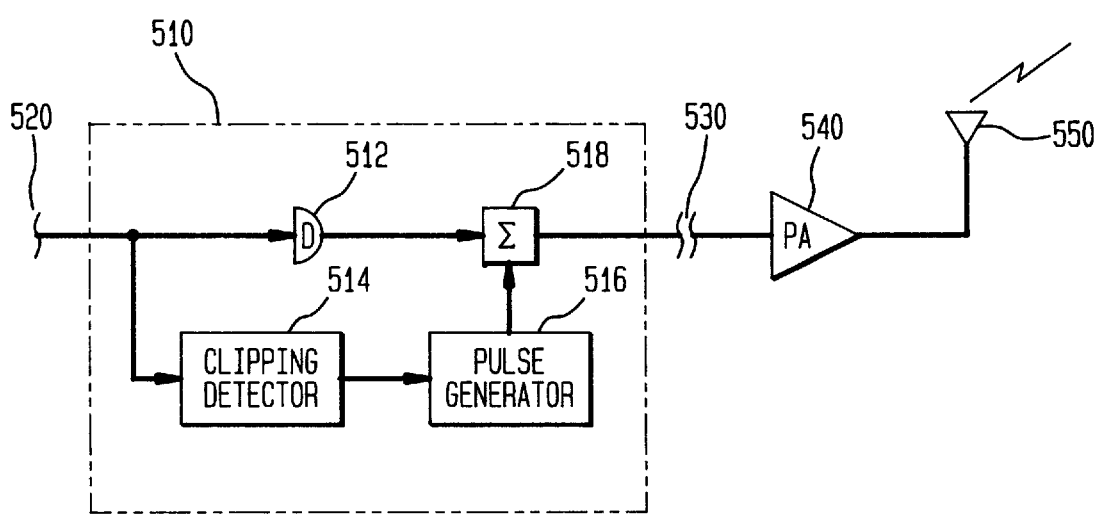
FIG. 5a is a block diagram representation of an exemplary embodiment of a tailored distorter, in accordance with the present invention.

FIG. 5a is a block diagram representation of an exemplary embodiment of a RF signal tailored distorter 510, in accordance with the present invention. When incorporated within a wireless communication system, the tailored distorter 510 is operable to receive a RF signal at a distorter inlet 520. The distorter outlet 530 is coupled to a RF power amplifier 540. The RF power amplifier 540 is coupled to an antenna 550 for RF signal transmission thereover. The distorter inlet 520 is coupled to the inlet of a delay unit 512, the delay unit 512 outlet is coupled to one input of a summing device 518, and the summing device 518 outlet comprises the distorter outlet 530. Clipping detector 514 is coupled so as to sense the RF signal peak amplitude at the distorter inlet. The clipping detector provides signal amplitude and peak timing data to the pulse generator 516. The pulse generator 516 outlet is coupled to a second input of the summing device 518.

Operation of the exemplary embodiment of the tailored distorter illustrated in FIG. 5a and in accordance with the present invention is next presented herein. The amplitude of a RF signal being processed by the tailored distorter 510 is monitored at the distorter inlet 520 by a clipping detector 514. If the amplitude of the monitored RF signal is determined to exceed a clipping threshold value, the clipping detector 514 conveys values corresponding to the monitored RF signal's peak amplitude and time of occurrence to the pulse generator 516. The clipping threshold value is chosen as that monitored signal amplitude (amplitude of RF signal prior to the amplification process) at which amplifier clipping would begin to occur if the monitored signal were conveyed to the RF signal amplifier unchanged. The clipping threshold value is easily determined for each amplifier configuration based upon the amplifier transfer function. Monitoring signal amplitude and developing a corresponding or proportional output based upon that signal amplitude is a technique well known in the art. For example, in one exemplary embodiment, a simple analog clipping detector is produced by coupling the monitored RF signal amplitude to the input of a reverse biased proportional amplifier. The amplifier is biased so that when the RF signal amplitude reaches a value corresponding to the clipping threshold value, the amplifier begins to produce an output. The greater the RF signal amplitude above the clipping threshold value, the greater the corresponding output. In a second exemplary embodiment, a digital clipping detector periodically samples the amplitude of the RF signal, classifies the amplitude value as belonging to a specific value group, and produces an output value corresponding to the specific value group. Those skilled in the art of circuit design would realize that there are numerous alternative embodiments for the design of a clipping detector 514.

The pulse generator 516 accepts the output from the clipping detector 514 and produces a pulse output whenever the clipping threshold value is exceeded, which when summed with the original RF signal decreases the RF signal amplitude so that the modified RF signal is not clipped when it is amplified. Although the modified RF signal is distorted, both prior to and after amplification at the RF power amplifier 540, the distortion is tailored to minimize the severity of spectral regrowth due to clipping. The modified RF signal is created by summing the pulse generator 516 output signal waveform with the original RF signal at the summing device 518. The time delay unit 512 is utilized to temporarily impede the original RF signal prior to summation with the pulse generator 516 output signal. The time delay is utilized to provide synchronous summation of the pulse generator 516 output signal with the corresponding portion of the original input waveform (that portion of the input waveform which provided the impetus for the formation of a pulse generator 516 output signal). Synchronization is maintained by setting the corresponding value of time delay associated with time delay unit 512 equal to the combined signal processing time associated with the clipping detector 514 and pulse generator 516.

Figure 5B:
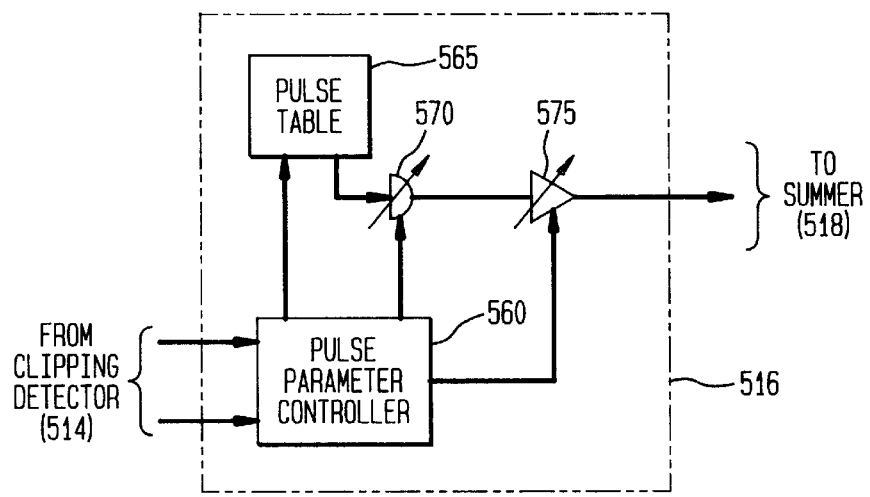
FIG. 5b is a block diagram representation of a pulse generator as incorporated within the tailored distorter of FIG. 5a, and in accordance with the present invention.

FIG. 5*b* is a block diagram representation of an exemplary embodiment of a pulse generator 516 as incorporated within the RF signal tailored distorter 510 of FIG. 5*a*, and in accordance with the present invention. The clipping detector 514 measures the time of occurrence of a RF signal waveform 410 which exceeds a threshold value 415 and concurrently quantifies the "excess amplitude" of the peak of RF signal waveform. The excess amplitude is the value of signal amplitude by which the RF signal waveform 410 exceeds the threshold value 415. The values for excess amplitude and occurrence timing are provided to a pulse parameter controller 560 which selects a pulse waveshape having the desired characteristics (e.g.—band-limited spectrum) from a pulse waveform look-up table 565. The desired characteristics, and hence the pulse waveshape selected, may alternatively be comprised of pulses having power spectra inside the signal bandwidth, outside the signal bandwidth, or an intermediate pulse (having a power spectra partially within signal bandwidth and partially outside of signal bandwidth), as previously described. One embodiment of the present invention stores the pulse waveform look-up table 565 within Read-Only Memory (ROM), although various other means for storage are also contemplated and would be apparent to those skilled in the art, including but not limited to RAM, magnetic or optical storage devices, PROM or EPROM, fixed component memory, or any other memory devices deemed appropriate for a given application. The selected pulse waveshape is conveyed to an adjustable delay circuit 570 prior to adjusting the amplitude of the waveshape with a variable gain circuit 575. The adjustable delay circuit 570 and variable gain circuit 575 are each controlled by the pulse parameter controller 560 to produce a tailored distortion pulse 420 with both the desired timing and amplitude (as determined and conveyed by the clipping detector 514). It is also contemplated, but not specified in conjunction with the detailed description of the present invention, that various alternative embodiments for designing and producing a pulse generator operable to perform the functions specified herein would be apparent to those skilled in the art.

As previously described, in the instant illustrated embodiment, the tailored distortion is selected to minimize the deleterious effects of signal clipping, however, tailored distortion may also be utilized to minimize the deleterious effects of other nonlinearities and discontinuities associated with amplification of a RF signal, as would be apparent to those skilled in the art. The present invention is also equally applicable whether applied over the modulating envelope of a RF signal waveform in which a plurality of consecutive amplitude peaks of the RF signal are clipped, or whether applied separately to each individual amplitude peak of the RF signal itself. While exemplary embodiments illustrated thus far are applicable to RF signals amplified by RF amplifiers, it would be apparent to those skilled in the art to apply the same techniques to various other amplifiers. For example, clipping distortion is a critical impairment in audio amplifiers. Consequently, high fidelity audio systems utilize audio power amplifiers rated for a peak output power significantly greater than the average power output. The present invention is applicable to audio systems in an embodiment in which the tailored distorter 510 further includes a spectral analyzer to analyze the instantaneous power spectrum of the audio signal prior to power amplification and convey that information to the pulse generator 516. Based upon the information provided, the pulse generator 516 produces a tailored distortion pulse having a power spectrum matching that of the audio signal (prior to amplification), but modifying the audio signal so that peak signal amplitudes are reduced and consequently not clipped by the power amplifier. Thus, the input signal to the power amplifier (which is subjected to tailored distortion) will produce a signal out of the power amplifier which is not clipped. This tailored distorted output signal, when converted to an acoustic audio signal, is more difficult for the human ear to discern as being distorted than the clipping distortion it replaces, because its spectral components are matched to those of the original signal. Thus, an audio system utilizing the present invention can use an audio power amplifier having a reduced peak power rating when compared to the necessary power rating of an audio amplifier incorporated within an audio system without tailored distortion.

It will also be apparent to those skilled in the art that the present invention is applicable to any system in which the occurrence of clipping would be a critical impairment. For example, when digitizing an analog waveform, an incorporated Analog-to-Digital Converter (ADC) frequently exhibits a finite range of acceptable input levels. Signals exceeding such a range are clipped. The present invention may be embodied into an algorithm which operates on the digitized waveform and replaces such clipping events with tailored distortion pulses. Operation on the clipped waveform (instead of operation on the waveform prior to clipping, as illustrated in FIG. 5a) is practicable since the shape of the distortion-causing waveform 420 is highly predictable as it displays little statistical variation (in terms of periodicity or amplitude). Therefore, in yet another embodiment of a tailored distortion scheme, distorter operation on a clipped waveform first reconstructs the shape of the distortion-causing pulse 420 associated with a clipping event and then computes an appropriate tailored distortion pulse to sum with the distortion-causing pulse to obtain a waveform which does not exceed the clipping threshold. Alternatively, the present invention may be utilized configured as the embodiment illustrated in FIG. 5a (for RF amplifiers) even in the instance when an ADC is used in place of an amplifier.

Figure 6:
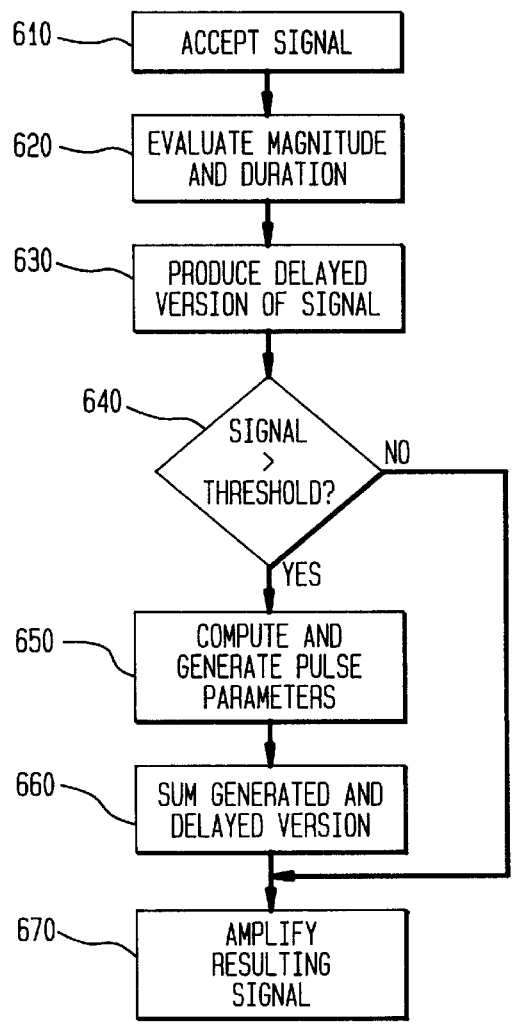
FIG. 6 is a flow chart of the process steps of an exemplary embodiment of a tailored distorter, in accordance with the present invention.

FIG. 6 is a flow chart of the process steps of an exemplary embodiment of a tailored distorter, in accordance with the present invention. In accordance with step 610, the tailored distorter is operable to accept a RF signal. The amplitude of the RF signal waveform is evaluated (sampled or monitored), by a clipping detection means, to determine whether signal peak amplitudes exceed the clipping threshold value, in accordance with step 620. The clipping detection means also determines the duration of time over which the signal amplitude exceeds the clipping threshold value and the amount by which the threshold is exceeded. A RF signal delay means is provided, in accordance with step 630, to delay the RF signal by an amount of time necessary to provide summing synchronization between the RF signal waveform and a later applied modifying waveform.

A comparator means is provided in accordance with step 640. The comparator means compares the value of the RF signal amplitude to a clipping threshold value. If the RF signal amplitude is less than the clipping threshold value, then the RF signal (with no intentionally applied modifying distortion) is amplified and transmitted, in accordance with step 670. However, if the RF signal amplitude exceeds the clipping threshold value, then in accordance with step 650, a modifying waveform is generated by a tailored distortion generating means. The amplitude of the modifying waveform generated by the tailored distortion generating means is determined as a function of the magnitude with which the RF signal amplitude exceeds the clipping threshold value. The RF signal waveform and the modifying waveform are summed to form a modified RF signal waveform, in accordance with step 660. Since the RF signal was previously subjected to a RF signal delay means for the purpose of summing synchronization, the RF signal waveform and the modifying distortion waveform are perfectly "aligned." That is, the instantaneous value of the RF signal waveform amplitude engendering the production of a corresponding instantaneous value of the modifying distortion waveform are summed, thereby selectively distorting the RF signal waveform whenever the original signal waveform exceeds the clipping threshold value. The modified RF signal waveform, when amplified by a RF power amplifier in accordance with step 670, will not experience clipping distortion.

Figure 7:
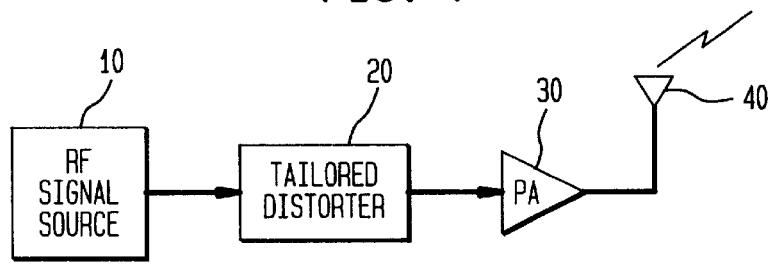
FIG. 7 is a block diagram of exemplary embodiment of a wireless RF transmission system incorporating a tailored distorter in accordance with the present invention and without a predistorter.
Figure 8:
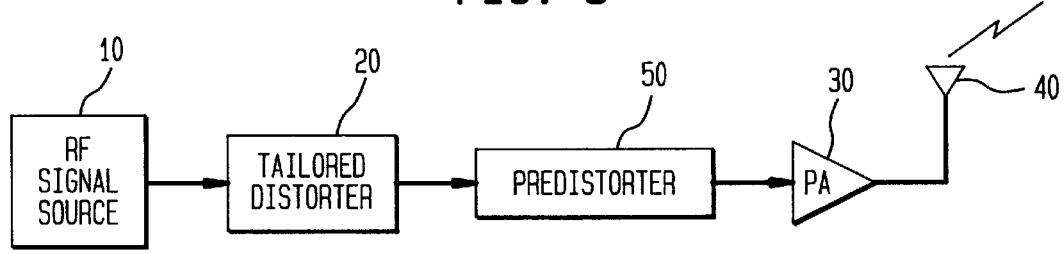
FIG. 8 is a block diagram of exemplary embodiment of a wireless RF transmission system incorporating a tailored distorter in accordance with the present invention and a predistorter, the predistorter subsequent to the tailored distorter in the signal processing path.
Figure 9:
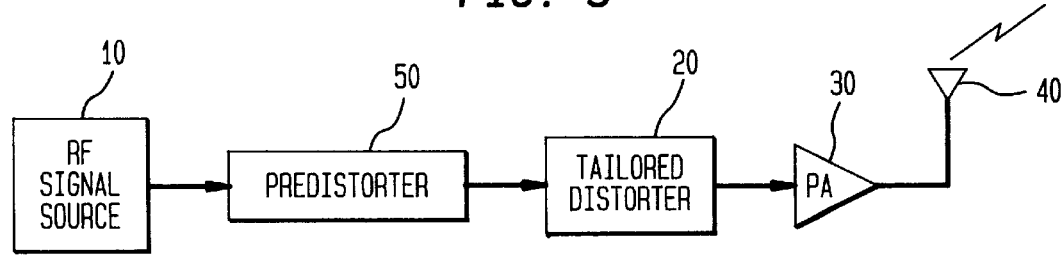
FIG. 9 is a block diagram of exemplary embodiment of a wireless RF transmission system incorporating a tailored distorter in accordance with the present invention and a predistorter, the predistorter preceding the tailored distorter in the signal processing path.

FIGS. 7, 8, and 9 are block diagrams of exemplary embodiments of wireless RF transmission systems, each incorporating a tailored distorter 50 in accordance with the present invention. In accordance with FIG. 7, a RF signal source 10 is coupled to the inlet of a tailored distorter 20. The outlet of the tailored distorter is coupled to the inlet of a RF power amplifier 30. The outlet of the RF power amplifier 30 is coupled to an antenna 40 for transmission thereover. FIG. 8 is a diagram of an exemplary embodiment in which the wireless system further comprises a predistorter 50. The predistorter 50 is utilized in conjunction with the tailored distorter 20, and is coupled and interposed between the tailored distorter 20 and the RF power amplifier 30. FIG. 9 is also a diagram of an exemplary embodiment comprising a predistorter 50 used in conjunction with the tailored distorter 20. However, in the embodiment illustrated in FIG. 9, the predistorter 50 is coupled and interposed between the RF signal source 10 and the tailored distorter 20. Therefore, embodiments of the present invention, each of which include a tailored distorter 20, are operable regardless of whether predistortion is utilized in conjunction with tailored distortion, and regardless of the relative sequential priority between predistortion and tailored distortion.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claim is reserved.

What is claimed is:

1. A method for processing and shaping an input signal prior to amplification by an amplifier, said method comprising the steps of:
   monitoring said input signal and detecting when an amplitude of said input signal exceeds a threshold value;
   generating a modifying waveform when said amplitude of said input signal exceeds said threshold value;
   delaying said input signal; and
   synchronously summing said modifying waveform and said delayed input signal to form a modified signal, said modified signal representing a tailored distortion of said input signal.

2. The method in accordance with claim 1 wherein said tailored distortion of said input signal prevents clipping of said modified signal while being amplified by said amplifier.

3. The method in accordance with claim 2 wherein said modifying waveform is completely comprised of spectral components within the bandwidth of said input signal.

4. The method in accordance with claim 2 wherein said modifying waveform is comprised of spectral components outside of the bandwidth of said input signal.

5. The method in accordance with claim 2 wherein said amplifier is incorporated within a wireless communication system.

6. The method in accordance with claim 5 further comprising the step of predistorting said input signal.

7. The method in accordance with claim 2 wherein said modifying waveform is a dampened oscillatory waveform.

8. The method in accordance with claim 2 wherein said modifying waveform is applied over a modulating envelope in which a plurality of consecutive amplitude peaks of said input signal exceed said threshold value.

9. The method in accordance with claim 2 wherein said modifying waveform is generated and applied separately for each individual amplitude peak of said input signal.

10. In a wireless radio frequency (RF) communication system, an apparatus for applying tailored distortion to shape a radio frequency (RF) signal prior to amplification by a RF power amplifier, said apparatus utilized to prevent clipping during amplification, said apparatus comprising:

means for comparing an amplitude of said RF signal with a threshold value, said means for comparing operable to generate a comparator output signal if said amplitude of said RF signal exceeds said threshold value;

means for generating a modifying waveform when said amplitude of said RF signal exceeds said threshold value;

means for delaying said RF signal to produce a delayed RF signal; and means for synchronously summing said modifying waveform and said delayed RF signal to form a modified RF signal, said modified RF signal having a modified RF signal peak value which is less than said threshold value, wherein said step of delaying said RF signal provides summing synchronization between said modifying waveform and said delayed RF signal.

11. The apparatus in accordance with claim 10 wherein said wireless RF communication system is a Time Division Multiple Access (TDMA) based communication system.

12. The apparatus in accordance with claim 10 wherein said wireless RF communication system is a Frequency Division Multiple Access (FDMA) based communication system.

13. The apparatus in accordance with claim 10 wherein said wireless RF communication system is a Code Division Multiple Access (CDMA) based communication system.

14. The apparatus in accordance with claim 10 wherein said modified RF signal is further subjected to predistortion.

15. The apparatus in accordance with claim 14 wherein said modifying waveform is a dampened oscillatory waveform.

16. The apparatus in accordance with claim 15 wherein said modifying waveform is applied over a modulating envelope in which a plurality of consecutive amplitude peaks of said RF signal exceed said threshold value.

17. The apparatus in accordance with claim 15 wherein said modifying waveform is generated and applied separately for each individual amplitude peak of said RF signal.

18. An apparatus for processing and shaping a signal prior to amplification by an amplifier, said apparatus comprising:

a time delay unit having a delay unit first end and a delay unit second end;

a waveform monitor having a first monitor end and a second monitor end, said first monitor end coupled to monitor a signal amplitude at said delay unit first end, said waveform monitor producing a monitor output signal at said second monitor end when said signal amplitude exceeds a threshold value;

a pulse generator having a first pulse generator end and a second pulse generator end, said first pulse generator end coupled to said second monitor end, said pulse generator producing a modifying waveform when said monitor output signal is available at said first pulse generator end;

a summing device having a summing device outlet end, a summing device first inlet, and a summing device second inlet, said second pulse generator end coupled with said summing device first inlet, said delay unit second end coupled with said summing device second inlet, said summing device operable to synchronously sum said signal with said modifying waveform to produce a modified signal waveform at said summing device outlet end.

19. The apparatus in accordance with claim 18 wherein said modified signal waveform is created to prevent clipping when applied to said amplifier.

20. The apparatus in accordance with claim 19 wherein said modifying waveform is applied over a modulating envelope in which a plurality of consecutive amplitude peaks of said signal exceed said threshold value.

21. The apparatus in accordance with claim 19 wherein said modifying waveform is generated and applied separately for each individual amplitude peak of said signal.

22. In a wireless radio frequency (RF) communication system, a method for applying tailored distortion to shape a radio frequency (RF) signal prior to amplification by a RF power amplifier, said method utilized to control and minimize out-of-band emissions due to signal clipping during said amplification, said method comprising the steps of:

monitoring said RF signal and detecting when an amplitude of said RF signal exceeds a threshold value;

generating a modifying waveform when said amplitude of said RF signal exceeds said threshold value;

delaying said RF signal; and synchronously summing said modifying waveform and said delayed RF signal to form a modified RF signal, said modified RF signal representing a tailored distortion of said RF signal, said modified RF signal having a modified RF signal peak value which will not cause signal clipping if applied at an amplifying input of said RF power amplifier, wherein said step of delaying said RF signal provides summing synchronization between said modifying waveform and said delayed RF signal.

23. The method in accordance with claim 22 wherein said wireless RF communication system is a Time Division Multiple Access (TDMA) based communication system.

24. The method in accordance with claim 22 wherein said wireless RF communication system is a Frequency Division Multiple Access (FDMA) based communication system.

25. The method in accordance with claim 22 wherein said wireless RF communication system is a Code Division Multiple Access (CDMA) based communication system.

* * * * *

UNITED STATES PATENT AND TRADEMARK OFFICE
CERTIFICATE OF CORRECTION

PATENT NO. : 6,175,270 B1 Page 1 of 1
APPLICATION NO. : 09/035213
DATED : January 16, 2001
INVENTOR(S) : Vannucci It is certified that error appears in the above-identified patent and that said Letters Patent is hereby corrected as shown below:

In the claims:
Claim 1, colum 12 at the beginning of line 35, please delete "generating a modifying waveform".
Claim 1, column 12 line 36, after "threshold value" please add --, selecting a compensatory pulse waveshape from a storage means and generating a modifying waveform derived from said selected pulse shape--
Claim 10, column 13 at the beginning of line 9, please add --pulse generation--.
Claim 22, column 14 at the beginning of line 32, please delete "generating a modifying waveform".
Claim 22, column 14 line 33, after "threshold value" please add --, selecting a compensatory pulse waveshape from a storage means and generating a modifying waveform derived from said selected pulse shape--.

Signed and Sealed this

Third Day of July, 2007

JON W. DUDAS
*Director of the United States Patent and Trademark Office*